(12) United States Patent
Qi et al.

(10) Patent No.: US 9,964,577 B2
(45) Date of Patent: May 8, 2018

(54) WIRELESS TERMINAL TESTING SYSTEM

(71) Applicant: GENERAL TEST SYSTEMS INC., Shenzhen (CN)

(72) Inventors: Yihong Qi, Shenzhen (CN); Wei Yu, Shenzhen (CN)

(73) Assignee: GENERAL TEST SYSTEMS INC., Shenzhen (CN)

( * ) Notice: Subject to any disclaimer, the term of this patent is extended or adjusted under 35 U.S.C. 154(b) by 0 days. days.

(21) Appl. No.: 15/565,305

(22) PCT Filed: Mar. 24, 2016

(86) PCT No.: PCT/CN2016/077237
§ 371 (c)(1),
(2) Date: Oct. 9, 2017

(87) PCT Pub. No.: WO2016/161898
PCT Pub. Date: Oct. 13, 2016

(65) Prior Publication Data
US 2018/0080968 A1  Mar. 22, 2018

(30) Foreign Application Priority Data

Apr. 10, 2015 (CN) .......................... 2015 1 0169661

(51) Int. Cl.
*H04B 17/00* (2015.01)
*H01Q 15/00* (2006.01)
*G01R 29/10* (2006.01)
*H04B 17/29* (2015.01)

(52) U.S. Cl.
CPC .......... *G01R 29/105* (2013.01); *H04B 17/29* (2015.01)

(58) Field of Classification Search
CPC ........ H01Q 3/26; H01Q 3/2605; H01Q 15/00; H01Q 15/0066; H04B 17/00; H04B 17/10
See application file for complete search history.

(56) References Cited

U.S. PATENT DOCUMENTS

| | | | | |
|---|---|---|---|---|
| 7,965,986 B2 * | 6/2011 | Foegelle | ............... | H04W 24/00 324/627 |
| 8,912,963 B2 * | 12/2014 | Mow | .................. | H04B 17/0087 343/703 |
| 9,002,287 B2 * | 4/2015 | Mow | ...................... | G01R 29/10 455/13.3 |
| 9,322,864 B2 * | 4/2016 | Foegelle | ............... | G01R 29/105 |
| 9,705,190 B2 * | 7/2017 | Kyosti | ................. | H01Q 3/2605 |

* cited by examiner

*Primary Examiner* — Blane Jackson
(74) *Attorney, Agent, or Firm* — Hodgson Russ LLP

(57) ABSTRACT

Provided is a system for testing a wireless terminal. The wireless terminal is configured as a device under test. The system includes: a test antenna; a reflecting surface, configured to totally reflect one or more first wireless signals emitted by the device under test; an absorbing screen, configured to absorb one or more second wireless signals emitted by the device under test, in which the one or more second wireless signals are emitted by the device under test toward a direction of the test antenna without reflection through the reflecting surface; a controller, coupled to the device under test and configured to control the device under test to emit the one or more first and second wireless signals; a power detection device, configured to detect a power of the one or more first wireless signals reflected by the reflecting surface and received by the test antenna.

14 Claims, 7 Drawing Sheets

WIRELESS TERMINAL TESTING SYSTEM

CROSS-REFERENCE TO RELATED APPLICATIONS

This application is a U.S. national phase of International Application No. PCT/CN2016/077237, filed with the State Intellectual Property Office of P.R. China on Mar. 24, 2016, the entire content of which is incorporated herein by reference.

FIELD

The present disclosure relates to the field of testing technology, and more particularly, to a system for testing a wireless terminal.

BACKGROUND

In radiated performance test of a wireless terminal, radiation signals and receiver sensitivities in a plurality of directions should be measured, and a total radiated power (TRP for short) and a total isotropic sensitivity (TIS for short) are obtained by mathematical calculation based on the measured data. Since an antenna of a mobile wireless communication terminal is usually not directional, but radiates to all directions of space, when testing wireless performance of the mobile terminal, a basic idea is to put a device under test at a center of a sphere, measure signal strengths at a plurality of positions on surface of the sphere by test antennas, and calculate a total radiated intensity after obtaining measured values of all positions.

At present, according to a test standard of CTIA (Cellular Telecommunications Industry Association), a great circle test method is used mainly. A mobile terminal under test is put on a center of a three dimensional turntable, and may rotate around two axes with the turntable. By using one test antenna and setting both the mobile terminal and the test antenna in an anechoic chamber, the direct signal emitted to the test antenna by the mobile terminal under test is received by the test antenna, and the radiation signals emitted to other directions by the mobile terminal are absorbed by absorbing material set in the anechoic chamber. When testing, the mobile terminal is rotated with a preset angle interval according to a test demand. The mobile terminal is stopped to measure the signal strength when rotated to each position. A test duration may be reduced by adjusting the angle interval. After the radiation signals in all directions are tested, a test result is generated by integration and other data processing accordingly.

However, a test speed of this system is low, and it is needed that a distance between the test antenna and the device under test to be larger than a far field distance, thus causing a huge volume, a high manufacturing cost, and a small application scope of the test system.

SUMMARY

It is provided in embodiments of the present disclosure a system for testing a wireless terminal. The wireless terminal is configured as a device under test. The system includes: a test antenna; a reflecting surface, configured to totally reflect one or more first wireless signals emitted by the device under test; and an absorbing screen, configured to absorb one or more second wireless signals emitted by the device under test, in which the one or more second wireless signals are emitted by the device under test toward a direction of the test antenna without reflection through the reflecting surface; a controller, coupled to the device under test and configured to control the device under test to emit the one or more first and second wireless signals; a power detection device, configured to detect a power of the one or more first wireless signals reflected by the reflecting surface and received by the test antenna; in which the device under test, the test antenna and the reflecting surface correspond to a same ellipsoid, the device under test and the test antenna are arranged at two foci of the ellipsoid respectively, the reflecting surface is arranged on the ellipsoidal surface, and the absorbing screen is arranged on a straight line between the device under test and the test antenna.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

Above and/or additional aspects and advantages of the present disclosure will become apparent and more easily to understand from the following descriptions of the embodiments of the present disclosure with reference to the drawings, in which.

DETAILED DESCRIPTION

Figure 1:
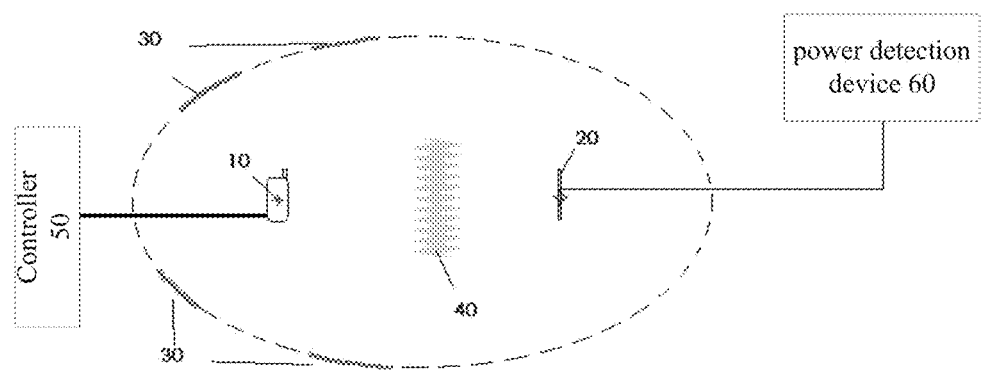
FIG. 1 is a schematic diagram illustrating a structure of a system for testing a wireless terminal according to embodiments of the present disclosure.

Reference will now be made in detail to exemplary embodiments, examples of which are illustrated in the accompanying drawings, wherein the same or similar elements and the elements having same or similar functions are denoted by like reference numerals throughout the descriptions. Embodiments described herein with reference to drawings are explanatory, serve to explain the present disclosure, and are not construed to limit embodiments of the present disclosure. Instead, the embodiments of the present disclosure comprise all the variants, modifications and their equivalents within the spirit and scope of the present disclosure as defined by the claims.

The system for testing a wireless terminal according to embodiments of the present disclosure will be described below with reference to accompany drawings.

FIG. 1 is a schematic diagram illustrating a structure of a system for testing a wireless terminal according to an embodiment of the present disclosure. As illustrated in FIG. 1, the system for testing a wireless terminal includes a device under test 10, a test antenna 20, a reflecting surface 30, an absorbing screen 40, a controller 50 and a power detection device 60.

In detail, the device under test 10 may be a wireless terminal; the reflecting surface 30 is configured to totally reflect one or more wireless signals emitted by the device under test 10; and the device under test 10, the test antenna 20 and the reflecting surface 30 correspond to a same ellipsoid, in which the device under test 10 and the test antenna 20 are arranged at two foci of the ellipsoid respectively, and the reflecting surface 30 is arranged on the ellipsoidal surface; and the absorbing screen 40 is arranged on a straight line between the device under test 10 and the test antenna 20.

In detail, the ellipsoid may be a virtual ellipsoid or a physical ellipsoid made of a nonmetallic material, for example a thin wall made of plastic. The reflecting surface 30 is made of a metallic material such copper or aluminum. The reflecting surface 30 is arranged at a position of the ellipsoidal surface and is consistent with the ellipsoidal surface at where the reflecting surface 30 is arranged, i.e. the reflecting surface 30 becomes a part of the virtual ellipsoidal surface. In an embodiment, the reflecting surface 30 may be obtained by metallization at a preset position on an inside wall of a plastic ellipsoidal surface.

Furthermore, according to test demand, there may be one, two or more reflecting surfaces 30. The shape of the reflecting surface 30 may include a plurality of types such as an annular type, bar-type etc., which will not be listed one by one.

The absorbing screen 40 is made of wave-absorbing material which can absorb a radio wave, such as an electromagnetic wave. The absorbing screen 40 is configured to absorb a direct signal emitted from the device under test 10 to the test antenna 20.

The controller 50 is coupled to the device under test 10 and configured to control the device under test 10 to emit the one or more wireless signals. The power detection device 60 is configured to detect a power of one or more wireless signals received by the test antenna 20.

A principle of a system for testing according to the present disclosure will be further illustrated as follows.

Figure 2:
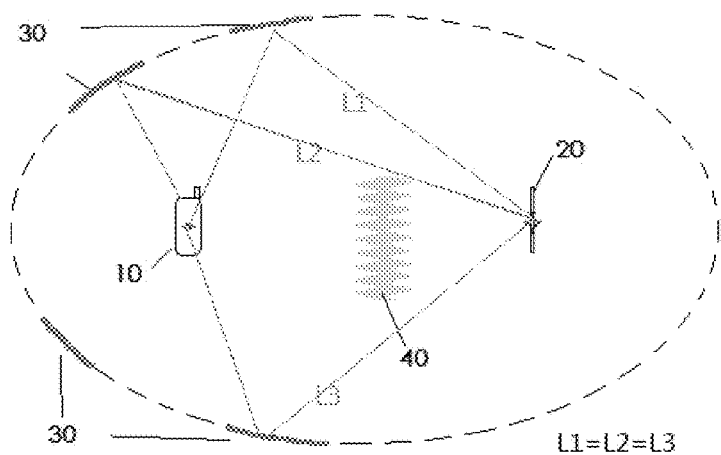
FIG. 2 is a schematic diagram illustrating a signal reflection principle of a system for testing a wireless terminal according to embodiments of the present disclosure.

As illustrated in FIG. 2, according to a definition and a property of the ellipsoid, an electromagnetic wave signal emitted from one focus may be reflected to the other focus by the reflecting surface 30. According to physical principles of an ellipsoidal reflection surface, propagation path lengths L1, L2 and L3 of electromagnetic wave signals that are emitted from one focus and reflected by the reflecting surface 30 to the other focus are the same. Therefore, phase differences caused by the propagation paths are same, thus when the electromagnetic wave signals emitted from one focus are reflected and converged to the other focus, in-phase superposition may be achieved. It should be noticed that the absorb screen 40 is specifically arranged between the device under test 10 and the test antenna 20 to absorb the direct signal emitted from the device under test 10 to the test antenna 20 without reflection. The propagation path of the direct signal is different from that of the reflected signal and the phase differences caused by the different propagation paths may be different too. If the direct signal emitted from the device under test to the test antenna 20 is not absorbed or blocked, objectives such as in-phase superposition and power combining may not be achieved when the direct signal and the reflected signal arrive at the test antenna 20. Since the direct signal is absorbed by the absorbing screen 40, the influence of the direct signal is no longer considered in following descriptions.

Figure 3:
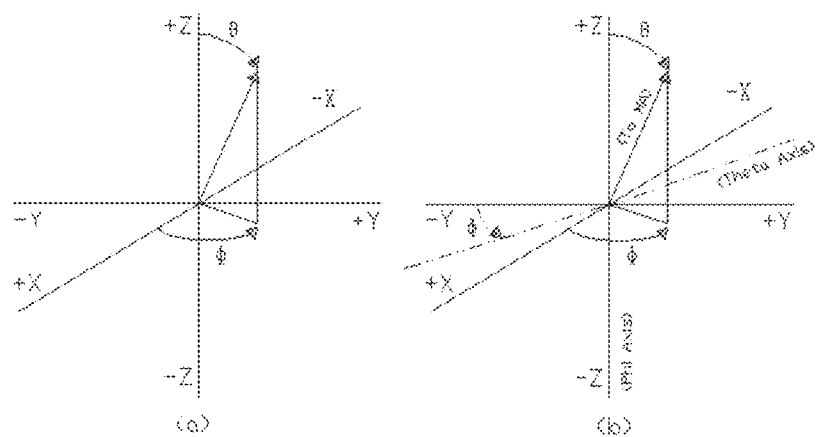
FIG. 3 is a schematic diagram illustrating a space coordinate system of a system for testing a wireless terminal according to embodiments of the present disclosure.

In embodiments of the present disclosure, the number and position(s) of the reflecting surface(s) 30 may be selected according to the test demand of the device under test 10. For convenience of description, a coordinate system as illustrated in FIG. 3 is utilized, and a mobile phone is taken as an example of the device under test 10. A direction of a longest side of the mobile phone is taken as a z axis, a top side of the mobile phone is toward a positive direction of the z axis; an x axis is perpendicular to a screen of the mobile phone, and a positive direction of the x axis points to a front side of the screen. For example, according to the test demand, it is to be tested a power sum of radiation signals of three directions of ($\theta=30°$, $\varphi=90°$), ($\theta=30°$, $\varphi=270°$) and ($\theta=150°$, $\varphi=90°$), then three corresponding reflecting surfaces 30 may be arranged at positions on the ellipsoidal surface in the three directions of ($\theta=30°$, $\varphi=90°$), ($\theta=30°$, $\varphi=270°$) and ($\theta=150°$, $\varphi=90°$) respectively. Under this kind of settings, the signals are emitted by the mobile phone under a control of the controller 50. The signals emitted in the three directions of ($\theta=30°$, $\varphi=90°$), ($\theta=30°$, $\varphi=270°$) and ($\theta=150°$, $\varphi=90°$) are reflected by the corresponding reflecting surfaces 30 to another focus of the ellipsoid, and then received by the test antenna 20 arranged at the other focus. Since the signals arrived at the other focus may be superposed in-phase, an output of the test antenna 20 is the power sum of the signals in the three directions.

Figure 4:
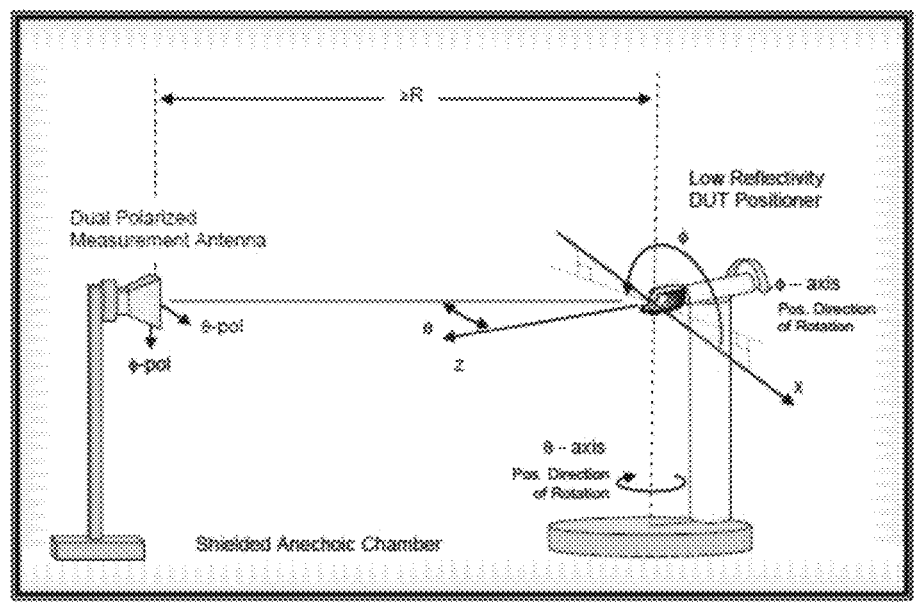
FIG. 4 is a schematic diagram illustrating a structure of a conventional system for testing a wireless terminal.

While if a test system in the related art as illustrated in FIG. 4 is utilized, a signal emitted from the device under test in each direction in the three-dimensional coordinate system must be measured, and then the power sum of the signals in the plurality of directions may be obtained by data processing and power addition.

With this embodiment, by converging radiation signals emitted from the device under test in a plurality of directions to the test antenna through the reflecting surface, in-phase superposition and power combining of the radiation signals in the plurality of directions is achieved at the test antenna, thus obtaining a power sum of the radiation signals emitted from the device under test in the plurality of directions at one time, simplifying operations, improving test efficiency, decreasing a repeatability error of test results, and making the test results more stable. In addition, since a conventional base station simulator is no longer needed in the test system, a manufacture cost may be reduced and a distance between the device under test and the test antenna may be smaller, such that the test system has a smaller volume, a lower cost and may be applied for a wider range.

It should be understood that for a direction from the device under test 10 towards the test antenna 20, the direct signal emitted by the device under test 10 in the direction towards the test antenna 20 cannot be measured because it is absorbed by the absorbing screen 40. Therefore, when the wireless signal in that direction needs to be measured, the device under test 10 should be rotated, so that the wireless signal in that direction may be reflected to the test antenna 20 by the reflecting surface 30 arranged in a corresponding position. Then a radiated power in that direction and the power sum of a plurality of directions of the device under test 10 may be obtained by changing the number of the reflection surfaces 30 or by a data processing method, etc.

Figure 5:
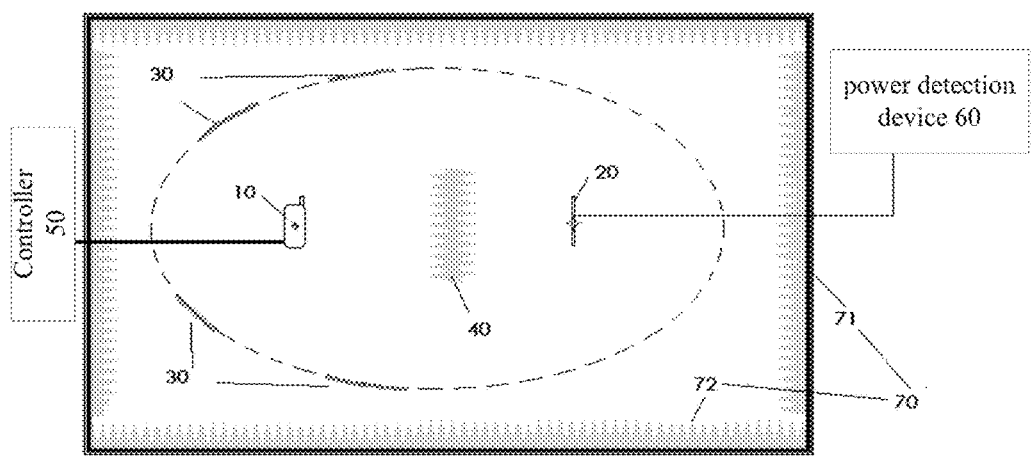
FIG. 5 is a schematic diagram illustrating a structure of a system for testing a wireless terminal according to another embodiment of the present disclosure.

In an embodiment of the present disclosure, as illustrated in FIG. 5, the system for testing a wireless terminal may further include an anechoic chamber 70. The anechoic chamber 70 includes a shielding box 71 and wave-absorbing material 72.

In detail, about the anechoic chamber 70, the device under test 10, the test antenna 20, the reflecting surface 30 and the absorb screen 40 are arranged inside the anechoic chamber 70. The anechoic chamber 70 includes the shielding box 71 and the wave-absorbing material 72 laid inside the shielding box 71. The shielding box 71 is made of a metallic material and configured to shield electromagnetic interference of outside. The wave-absorbing material 72 may be laid inside the shielding box 71, and configured to absorb electromagnetic waves emitted to the internal walls of the shielding box 71, so as to reduce reflections inside the shielding box 71. The shielding box 71 and the wave-absorbing material 72 inside the shielding box 71 may constitute the anechoic chamber 70.

Furthermore, in an embodiment of the present disclosure, the controller 50 and the power detection device 60 may be arranged in a same housing, and the housing is located outside the anechoic chamber 70.

In an embodiment of the present disclosure, the system for testing a wireless terminal may further include a clamp (not illustrated in figures).

The clamp is configured to fix the device under test and adjust an angle of the device under test according to the test demand.

The absorb screen 40 is made of wave-absorbing material, and the wave-absorbing material may be a sponge dipped by carbon powder.

The device under test 10, the test antenna 20, the reflecting surface 30 and the absorbing screen 40 are arranged at corresponding positions by a support part made of a non-metallic material. In detail, the support part may be made of a nonmetallic material with a low dielectric constant, such as rigid foams. The device under test 10 and the test antenna 20 are supported and fixed on the two foci of the ellipsoid, and the reflecting surface 30 and the absorb screen 40 are arranged in corresponding positions. There may be a plurality of specific solutions, which will not be listed one by one.

It should be understand that, in actual measurement, angles which correspond to biggest radiation intensity of the device under test are usually selected to be measured to save time. The number and position(s) of the reflecting surface(s), the shape of the reflecting surface and other parameters may be set according to the test demand.

Some typical reflecting surfaces may be utilized in the system for testing are as follows.

Figure 6:
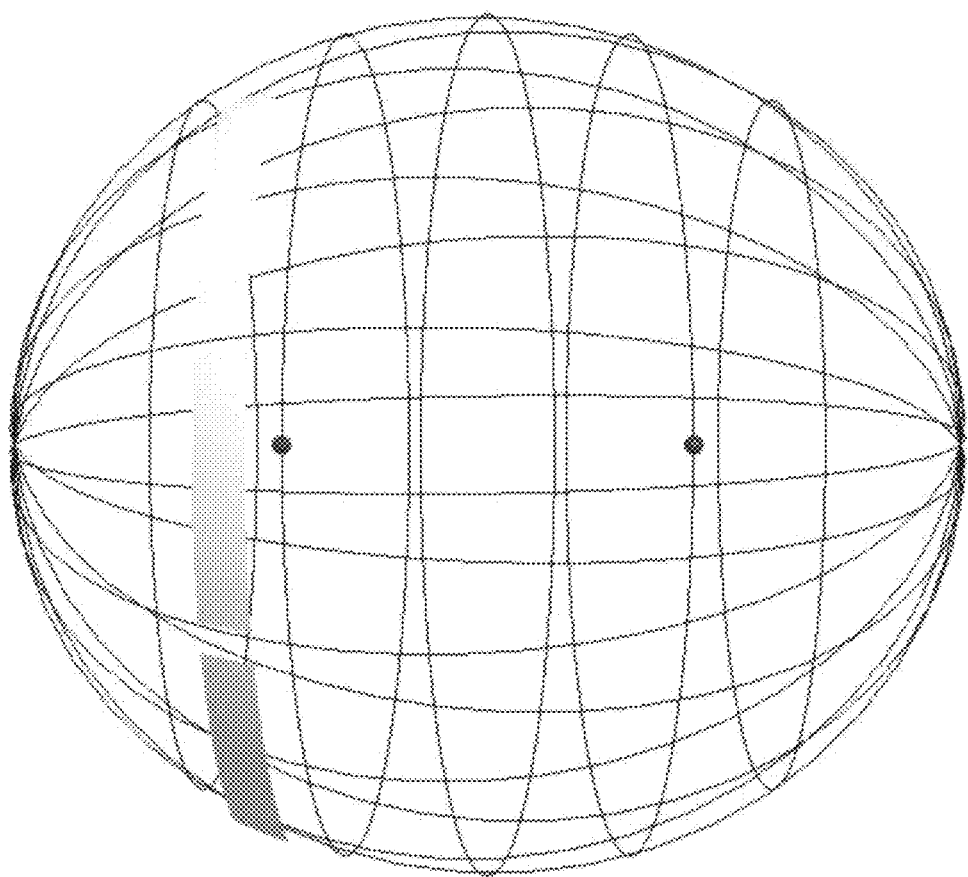
FIG. 6 is a schematic diagram illustrating a system for testing a wireless terminal and with three reflecting surfaces according to embodiments of the present disclosure.
Figure 7:
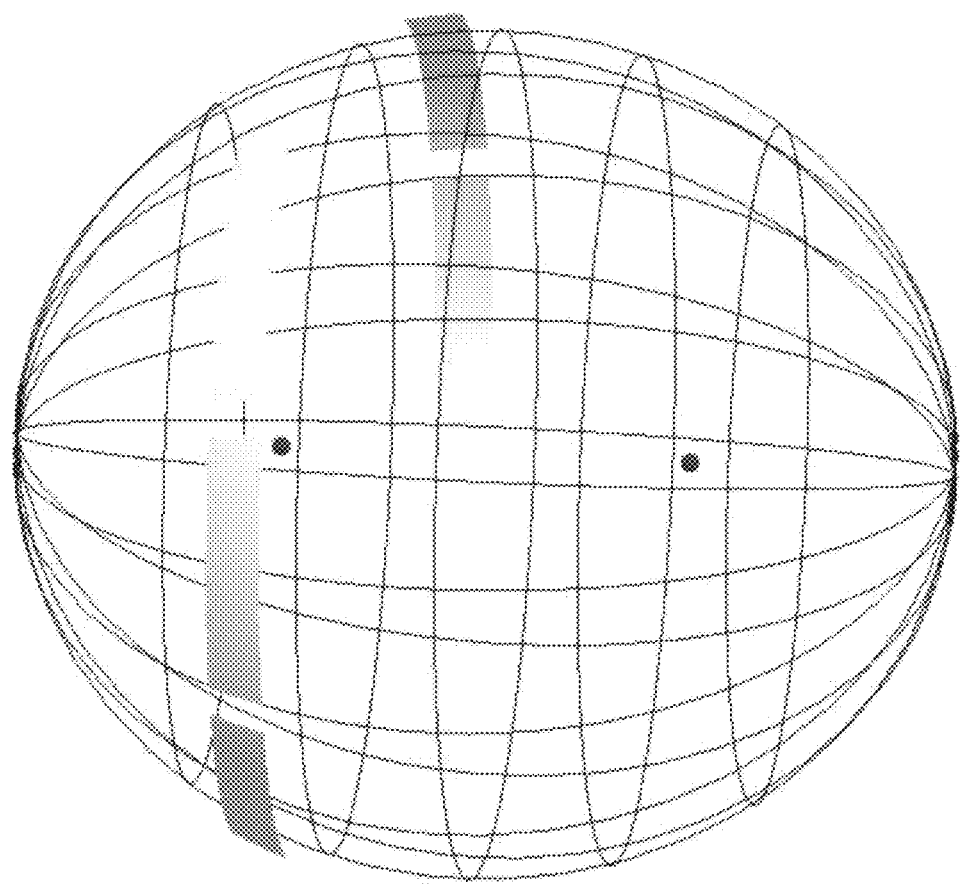
FIG. 7 is a schematic diagram illustrating a system for testing a wireless terminal and with six reflecting surfaces according to embodiments of the present disclosure.
Figure 8:
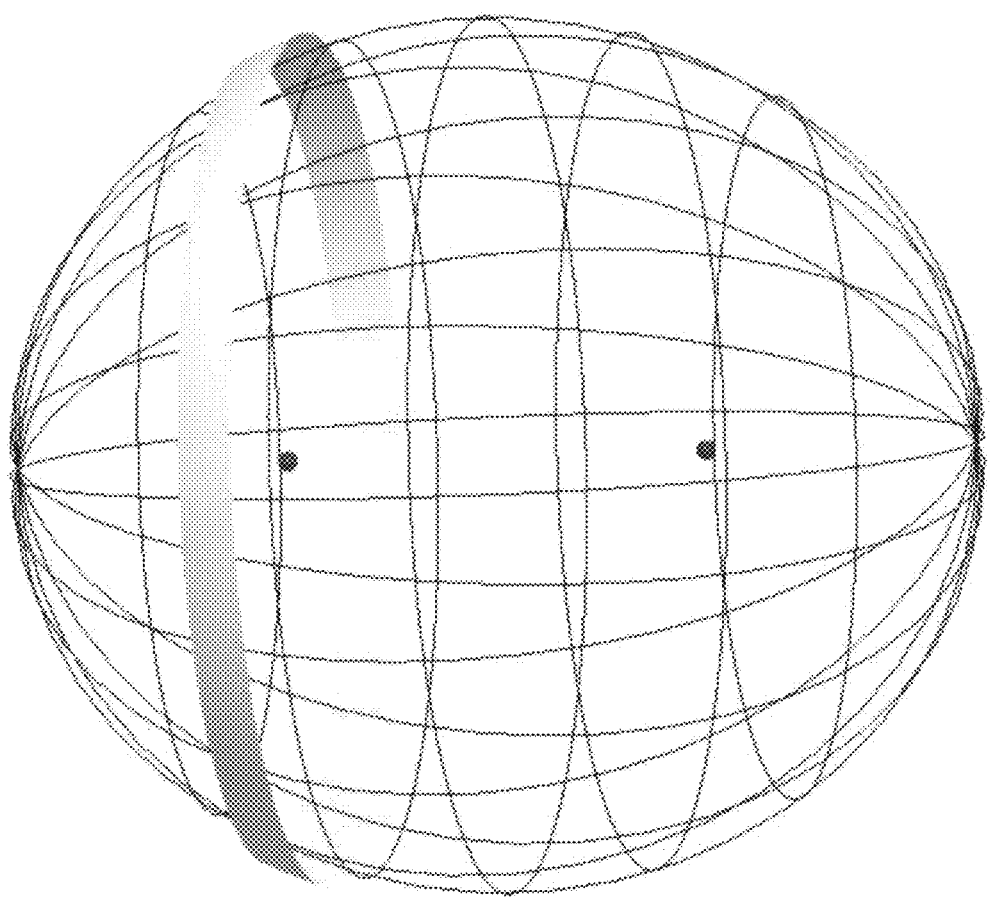
FIG. 8 is a schematic diagram illustrating a system for testing a wireless terminal and with an annular reflecting surface according to embodiments of the present disclosure.
Figure 9:
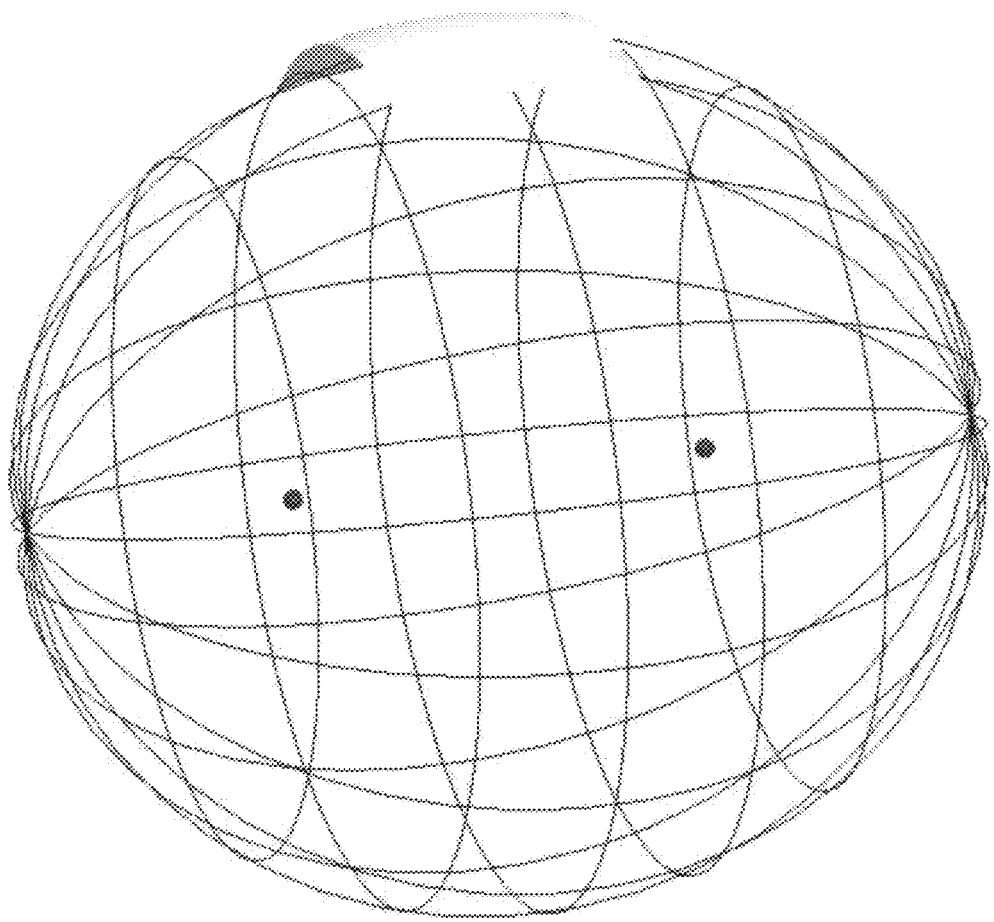
FIG. 9 is a schematic diagram illustrating a system for testing a wireless terminal and with a spherical reflecting surface according to embodiments of the present disclosure.

Taking three reflecting surfaces as an example, as illustrated in FIG. 6, the three reflecting surfaces are located around one focus, a plane containing the focus and perpendicular to the long axis of the ellipsoid is intersected with the three reflecting surfaces, and the three reflecting surfaces are not opposite to each other. Taking six reflecting surfaces as another example, as illustrated in FIG. 7, three reflecting surfaces of which are at the same position with that in FIG. 6, the other three reflecting surfaces are in a plane perpendicular to the long axis of the ellipsoid, and closer to the other focus. Besides, the reflecting surface may also be in an annular shape as illustrated in FIG. 8 or in shape of partial of the ellipsoidal surface as illustrated in FIG. 9.

With this embodiment, by converging radiation signals emitted from the device under test in a plurality of directions to the test antenna through the reflecting surface, in-phase superposition and power combining of the radiation signals in the plurality of directions is achieved at the test antenna, thus obtaining a power sum of the radiation signals emitted from the device under test in the plurality of directions at one time, simplifying operations, improving test efficiency, decreasing a repeatability error of test results, and making the test results more stable. In addition, radiated power tests of different angles may be achieved by arranging the position(s), the number and the shape of the reflecting surface(s), and by changing the angle of device under test, thus applying for a wider range. Besides, since a conventional base station simulator is no longer needed in the test system, a manufacture cost may be reduced and the distance between the device under test and the test antenna may be smaller, such that the test system has a smaller volume, a lower cost, and be more suitable for manufacture.

It should be noted that in the description of the present disclosure, terms such as "first" and "second" are used herein for purposes of description and are not intended to indicate or imply relative importance or significance or to imply the number of indicated technical features. In addition, in the description of the present disclosure, "a plurality of" means two or more than two, unless specified otherwise.

Reference throughout this specification to "an embodiment", "some embodiments", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples.

Although embodiments of the present disclosure have been illustrated and described above, it should be understood that above embodiments are just explanatory, and cannot be construed to limit the present disclosure, for those skilled in the art, changes, alternatives, and modifications can be made in the embodiments without departing from spirit, principles, and scope of the present disclosure.

What is claimed is:

1. A system for testing a wireless terminal, wherein the wireless terminal is configured as a device under test and the system comprises:
   a test antenna;
   a reflecting surface, configured to totally reflect one or more first wireless signals emitted by the device under test;
   an absorbing screen, configured to absorb one or more second wireless signals emitted by the device under test, wherein the one or more second wireless signals are emitted by the device under test toward a direction of the test antenna without reflection through the reflecting surface;
   a controller, coupled to the device under test and configured to control the device under test to emit the one or more first and second wireless signals;
   a power detection device, configured to detect a power of the one or more first wireless signals reflected by the reflecting surface and received by the test antenna;
   wherein the device under test, the test antenna and the reflecting surface correspond to a same ellipsoid, the device under test and the test antenna are arranged at two foci of the ellipsoid respectively, the reflecting surface is arranged on the ellipsoidal surface, and the absorbing screen is arranged on a straight line between the device under test and the test antenna.

2. The system according to claim 1, wherein, the number of the reflecting surfaces is at least two.

3. The system according to claim 2, wherein, the number of the reflecting surfaces is 3 or 6.

4. The system according to claim 1, further comprising:
an anechoic chamber, wherein the device under test, the test antenna, the reflecting surface, and the absorbing screen are arranged in the anechoic chamber.

5. The system according to claim 4, wherein, the anechoic chamber comprises:
a shielding box and a wave-absorbing material laid inside the shielding box.

6. The system according to claim 5, wherein, the controller and the power detection device are arranged in a same housing and the housing is located outside the anechoic chamber.

7. The system according to claim 1, further comprising:
a clamp, configured to fix the device under test and adjust an angle of the device under test according to test demand.

8. The system according to claim 1, wherein, the absorbing screen is made of a wave-absorbing material.

9. The system according to claim 8, wherein, the wave-absorbing material is a sponge dipped by magnetic carbon powder.

10. The system according to claim 1, wherein, the device under test, the test antenna, the reflecting surface and the absorbing screen are arranged at corresponding positions by a support part made of a nonmetallic material.

11. The system according to claim 1, wherein, the ellipsoid is a virtual ellipsoid.

12. The system according to claim 1, wherein, the ellipsoid is a physical ellipsoid made of a nonmetallic material.

13. The system according to claim 12, wherein the reflecting surface is obtained by metallization at a preset position on an inside wall of the physical ellipsoid surface.

14. The system according to claim 1, wherein, the reflecting surface is made of a metallic material.

* * * * *